United States Patent
Hasegawa et al.

(10) Patent No.: US 6,337,498 B1
(45) Date of Patent: Jan. 8, 2002

(54) SEMICONDUCTOR DEVICE HAVING DIRECTIONALLY BALANCED GATES AND MANUFACTURING METHOD

(75) Inventors: Shigeru Hasegawa; Hideo Matsuda; Yoshiro Baba, all of Yokohama; Masanobu Tsuchitani, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/249,296

(22) Filed: Feb. 12, 1999

(30) Foreign Application Priority Data

Feb. 12, 1998 (JP) .............................................. 10-029865

(51) Int. Cl.[7] ......................... H01L 29/94; H01L 31/113
(52) U.S. Cl. ....................... 257/328; 257/330; 257/332; 257/334
(58) Field of Search ................................ 257/341, 368, 257/622, 599, 206, 328–331, 336, 332, 334, 202, 204, 205, 401, 339, 342, 627, 628, 262, 263, 586, 577, 583, 197, 273, 329; 438/344

(56) References Cited

U.S. PATENT DOCUMENTS

| | | | | |
|---|---|---|---|---|
| 5,376,815 A | * | 12/1994 | Yokota et al. ............... | 257/341 |
| 5,444,275 A | * | 8/1995 | Kugishima et al. .......... | 257/206 |
| 5,541,430 A | * | 7/1996 | Terashima ................... | 257/342 |
| 5,574,302 A | * | 11/1996 | Wen et al. ................... | 257/330 |
| 5,635,736 A | * | 6/1997 | Funaki et al. ............... | 257/202 |
| 5,804,863 A | * | 9/1998 | Rhee .......................... | 257/401 |
| 5,929,482 A | * | 7/1999 | Kawakami et al. ......... | 257/328 |
| 5,986,304 A | * | 11/1999 | Hshieh et al. .............. | 257/330 |
| 6,060,739 A | * | 5/2000 | Saitoh ........................ | 257/314 |
| 6,060,744 A | * | 5/2000 | Kuwahara et al. .......... | 257/328 |

OTHER PUBLICATIONS

Chang et al., "500—V n–Channel Insulated–Gate Bipolar Transistor with a Trench Gate Structure", *IEEE Transaction on Electron Devices*, vol. 36, No. 9, September 1989, pp. 1824–1829.

* cited by examiner

Primary Examiner—Steven Loke
Assistant Examiner—Douglas W. Owens
(74) Attorney, Agent, or Firm—Oblon, Spivak, McClelland, Maier & Neustadt, P.C.

(57) ABSTRACT

A semiconductor device such as an IGBT having trench gates in a form of stripes, and manufacturing method, wherein concentration of stresses in only a single direction is relieved and the generation of a leakage current and crystal defects in the IGBT is prevented. In one embodiment, the inside of a terminal area of an IGBT is divided into a single gate pad area and plural element areas by a wiring area. The respective element areas are arranged in such a manner that the directions of trench gates formed in the respective element areas cross at right angles with respect to the directions of trench gates of respective adjacent element areas.

5 Claims, 3 Drawing Sheets

SEMICONDUCTOR DEVICE HAVING DIRECTIONALLY BALANCED GATES AND MANUFACTURING METHOD

BACKGROUND OF THE INVENTION

This invention relates to a semiconductor device and a semiconductor device manufacturing method, and in particular to an insulated gate type semiconductor device which has plural gate electrodes, and a method of manufacturing this device.

Hitherto, an IGBT (Insulated Gate Bipolar Transistor) has been well known as an insulated gate type semiconductor device which has plural gate electrodes. In the IGBT, from the standpoint of its ON-state resistance, turn-off loss, limit breaking current and the like, a trench gate structure in a stripe form has been frequently adopted as a gate electrode.

FIG. 6 schematically illustrates a conventional IGBT in which a trench gate structure in a stripe form is adopted.

In this IGBT 100, for example, a P-type base layer 103 is deposited on an N-type base layer 101 of a silicon substrate wherein a P-type emitter layer is disposed beneath the N-type base layer 101. Plural N-type source areas 104 are selectively positioned in the surface portion of this P-type base layer 103.

Moreover, In the surface portion of the P-type base layer 103, trenches 105 are selectively formed, each of which penetrates into the N-type source areas 104 and the P-type base layer 103 and has such a depth that the trenches reach the N-type base layer 101. The respective trenches 105 are in a form of stripes extending in a direction perpendicular to the illustrated sectional direction and have substantially the same length.

Resistance-reduced polysilicon is embedded through insulated gate films 106 in the respective trenches 105, so that respective trench type gate electrodes (trench gates) 107 are formed. An insulated oxide film 108 is deposited on each of upper portions of the trench gates 107, including a portion of the upper surface of the N-type source area.

Furthermore, an emitter electrode 109 is disposed on the upper portion or the P-type base area 103, including the upper portion of the insulated oxide film 108, so as to cover the whole of their upper surfaces. Additionally, a collector electrode 110 is disposed beneath the P-type emitter layer 102 of the silicon substrate.

Incidentally, as shown in, for example, FIG. 7, in the IGBT 100 having such a structure, the respective trench gates 107 are formed on the silicon substrate extending parallel to each other in the same direction.

Specifically, the inside of a terminal area 201 of the IGBT 100 is divided into, for example, a single gate pad area 201a and a plurality (three in this case) of element areas 201b. A wiring area 201c for leading polysilicon wirings from the gate pad area 201a is composed between the manual element areas 201b.

In the respective element areas 201b, usually, the respective trenches 105 are formed so that the directions of the trench gates 107 are along the same direction (in this case, the horizontal direction in FIG. 7), from the standpoint of capability of bonding to the polysilicon wirings. (For example, a section along the line a in FIG. 7 corresponds to FIG. 6.)

However, the IGBT 100 having the aforementioned structure is, in the process for manufacturing the IGBT, subjected to heat treatment, e.g., in the process of forming insulated oxide film 108 wherein phosphorus gathering after CVD deposition is performed, at high temperatures up to 900°–950° C. after polysilicon is embedded in the trenches 105. At this time, a stress is generated between the polysilicon and the silicon substrate because polysilicon is embedded in the trenches 105. A residual stress remains even after the temperature of the IGBT 100 is returned to ordinary temperature.

The arrangement pitch $L_1$ (see FIG. 6) of the trench gates 107 in the sectional direction is about 5 $\mu$m and crosses the sectional direction at right angles. The length of the trench gates 107 in their stripe direction is about several millimeters. In this case, the stress in the sectional direction (the illustrated arrow A direction) perpendicular to the trench gates 107 in equal to the total of the stresses at the respective trench gates 107, and is stronger than the stress in the stripe direction parallel to the trench gates 107 (the illustrate arrow B direction). This occurs because the area of junction between silicon and polysilicon is greater in the A direction than in the B direction and more trench gates are formed in the A direction than in the B direction.

Therefore, in particular, in the case of the IGBT 100 having a large area and a large number of the trench gates 107, there remains a problem that a leakage current and crystal defects are liable to arise because of the stress concentrating in the sectional direction (the illustrated arrow A direction) perpendicular to the trench gates 107.

In manufacturing such a type IGBT 100, as shown in FIG. 8, for example, generally plural IGBT pellets (P) 301 are formed on a single wafer 300 which is then divided for each of the IGBT pellets 301, resulting in obtaining the plurality of IGBTs 100 at the same time.

Conventionally, however, the respective IGBT pellets 301 have been formed on the wafer 300, so as to be wholly along the same direction (shown schematically in FIG. 8 by the orientation of "P"). In other words, the plural IGBTs 100 having trench gates 107 along the same direction have been formed in the same direction (in this case, the direction of the trench gates 107 coincides with the illustrated arrow B direction) on the wafer 300. The internal stress in the A direction illustrated in FIG. 7 is greater than that in the B direction in relation to the difference in sectional area of junction lines between silicon and polysilicon in the A and B directions, and in relation to the greater number of trench gates in the A direction than in the B direction.

For this reason, in particular where the diameter of the wafer 300 is large, the wafer 300 bends very much due to the stress concentrating in the sectional direction (the illustrated arrow A direction) perpendicular to the trench gates 107, as described above. This bend in the wafer disturbs subsequent treatments in the manufacturing process.

As described above, In the conventional IGBT, all of the trench gates are formed so that their directions are along the same direction, and consequently the stress in the direction perpendicular to the trench gates is stronger than the stress in the stripe direction. Thus, problematic leakage current and crystal defects arise by the strong stress in the direction perpendicular to the trench gates.

Moreover, in conventional IGBT manufacturing methods, there arises a problem that a wafer bends very much by the strong stress in the direction perpendicular to trench gates.

BRIEF SUMMARY OF THE INVENTION

Therefore, an object of the present invention is to provide a semiconductor device in which concentration of stress in only a single direction is relieved and generation of a leakage current and crystal defects is prevented.

Furthermore, another object of the present invention is to provide a semiconductor device manufacturing method making it possible to relieve concentration of stress only in a single direction and prevent a wafer from bending very much.

To attain the aforementioned object, a semiconductor device of this invention includes plural gate electrodes formed in parallel to each other in element areas in a single substrate, with the gate electrodes formed in such a manner that stresses generated between the substrate and the gate electrodes are substantially directionally balanced inside the substrate. To that end, the gate electrodes disposed in parallel to each other are arranged on a single substrate in such a manner that directions of the gate electrodes in adjacent element areas cross each other at angles, such as right angles, so as to balance stresses directionally within the wafer. Of importance is that stresses are not concentrated in a single direction but are balanced. This can be achieved by having directions of gate electrodes crossing at various angles so that on balance, stresses formed in one direction are balanced by stresses formed in a direction perpendicular thereto.

Furthermore, a semiconductor device of this invention includes a semiconductor substrate, a gate pad area located inside a terminal area on the semiconductor substrate, a wiring area located inside the terminal area and configured to lead wirings from the gate pad area, and plural element areas which are divided by the wiring area and are located inside the terminal area in such a manner that directions of respective gate electrodes located in parallel to each other cross directions of other gate electrodes in parallel with each other at angles, such as at right angles, so as to balance directionally stresses within the wafer.

Moreover, a semiconductor device manufacturing method of this invention, includes forming, on a single wafer, plural semiconductor devices in which plural gate electrodes are respectively formed on a semiconductor substrate, wherein the semiconductor devices are formed so that stresses generated between the substrate and the gate electrodes are substantially balanced directionally inside the wafer by arranging the plural gate electrodes in each device in parallel with each other but at angles with respect to the plural parallel gate electrodes of another device formed on the wafer.

According to a semiconductor device of this invention, the directions of stresses inside the substrate can be substantially directionally balanced. This makes it possible to relieve the influence of stress produced in a single direction.

Furthermore, according to a semiconductor device manufacturing method of this invention, the directions of stresses inside the wafer can be substantially directionally balanced. This makes it possible to manufacture a semiconductor device without influence of unidirectional stresses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

A more complete appreciation of the invention and many of the attendant advantages thereof will be readily obtained as the same become better understood by reference to the following detailed description when considered in connection with the accompanying drawings, wherein.

DETAILED DESCRIPTION OF THE INVENTION

Figure 1:
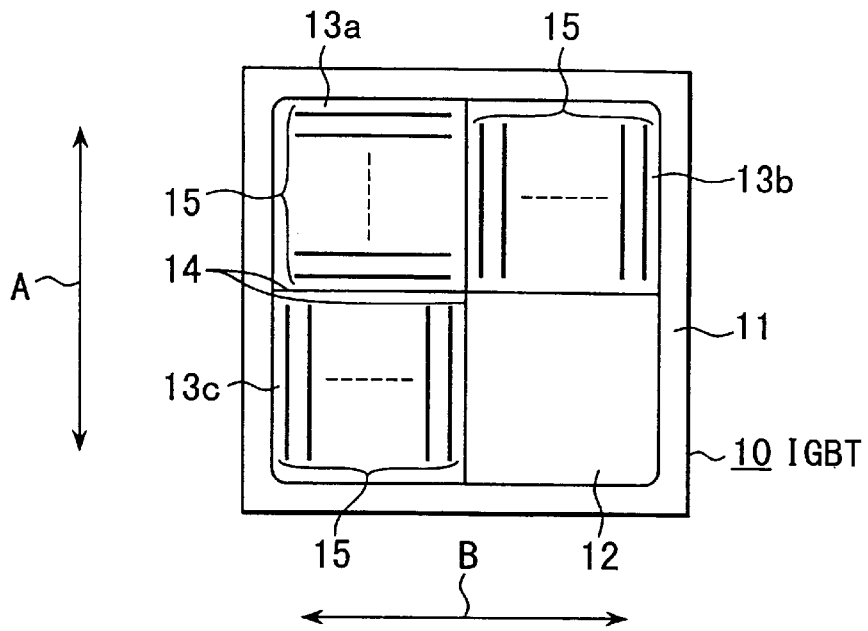
FIG. 1 is a schematic plan view illustrating a structure of an insulated gate type semiconductor device according to a first embodiment of this invention by way of an example of an IGBT having trench gates in a form of stripes.

Referring now to the drawings where like reference numerals refer to the same or corresponding parts throughout the several views, and more particularly FIG. 1 thereof, FIG. 1 schematically shows an entire structure of an IGBT using a trench gate structure comprising trench type insulated gates in a form of stripes, as an insulated gate type semiconductor device according to first embodiment of the present invention.

In this IGBT 10, for example, the inside of its terminal area 11 is divided into a single gate pad area 12 and three element areas 13a, 13b and 13c. The gate pad area 12 is located other than in a central portion, inside the terminal area 11. A wiring area 14 for leading polysilicon wirings from the gate pad area 12 is located around the elements areas 13a, 13b and 13c.

In this case, the element areas 13a, 13b and 13c are arranged in such a manner that the directions of trench gates 15 formed in the respective element areas cross each other at predetermined angles, such as right angles, (in such a manner that the directions of the trench gates 15 are not along the some direction) between the element area 13a and the element areas 13b and 13c.

Figure 6:
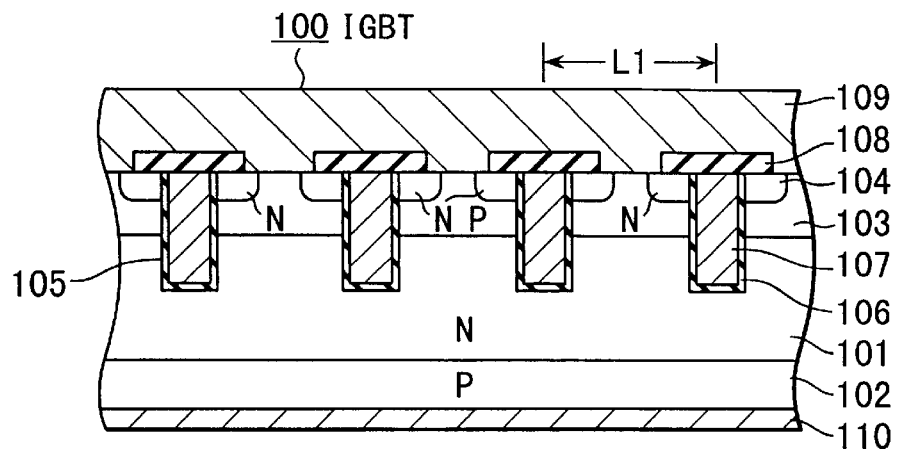
FIG. 6 is a schematic cross section of important components of an IGBT having trench gates in a form of stripes, illustrated for explaining prior art and problems thereof.

As regards the respective element areas 13a, 13b and 13c, their sectional structures are substantially the same as those of the aforementioned conventional IGBT 100 (came FIG. 6).

That is, the plural trench gates 15 each having a stripe form and having substantially the same length are disposed substantially in parallel inside the respective element areas 13a, 13b and 13c.

Moreover, the respective element areas 13a, 13b and 13c are arranged, for example, such that the directions (the illustrated arrow A direction) of the trench gates 15 in the element areas 13b and 13c are at angles with respect to the direction (the illustrated arrow B direction) of the trench gates 15 in the element area 13a adjacent to these element areas, such as at right angles.

Such a structure makes it possible to disperse or balance directionally stresses which are conventionally concentrated in only a single direction (the A direction in FIG. 7) into stresses concentrating in the sectional direction (the illustrated arrow A direction) perpendicular to the direction of the trench gates 15 in the element area 13a and stresses concentrating in the sectional direction (the illustrated arrow B direction) perpendicular to the direction of the trench gates 15 in the element areas 13b and 13c, and to reduce the total of the stresses in the single direction by half.

This can make it possible to substantially directionally balance, as a whole, the directions of the stresses concentrating in only a single direction perpendicular to the stripe direction of the trench gates 15, thus permitting to relieve concentration of the stresses in only a single direction in the IGBT 10.

Therefore, it becomes possible to overcome the generation of a leakage current and crystal defects caused by the stresses concentrating in a single direction even in the case of any IGBT having a large area and many trench gates 15.

As described above, the directions of the stresses inside the IGBT can be substantially directionally balanced.

Namely, the directions of the respective trench gates formed inside the respective element areas cross each other at right angles between all the element areas adjacent to each other in their right and left directions and in their upward and downward directions. This makes it possible to reduce the total of the stresses in a single direction, thereby permitting a decrease in influence of the stresses upon the single direction. Therefore, it becomes possible to relieve the stresses concentrating in only the single direction and prevent the generation of a leakage current and crystal defects even in the case of an IGBT having a large area and many trench gates.

In the above-described first embodiment of the present invention, the directions of trench gates in each element area cross at right angles with the directions of trench gates in adjacent element areas. However, the present invention is not limited to this example. For example, it is also possible to form trench gates such that their directions cross each other at right angles between element areas each composed of several subareas.

Figure 2:
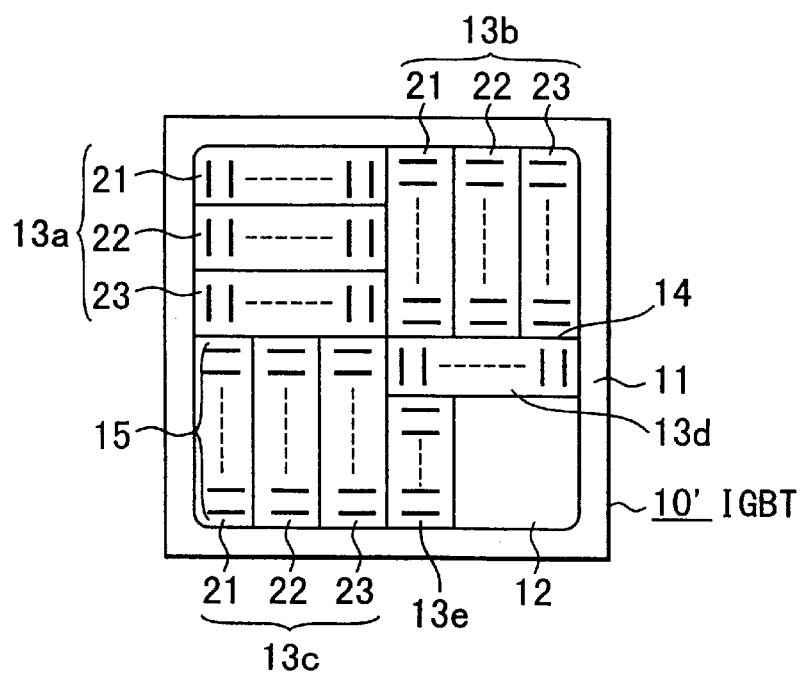
FIG. 2 is a schematic plan view illustrating a structure of an insulated gate type semiconductor device according to a second embodiment of this invention by way of an example of an IGBT having trench gates in a form of stripes.

FIG. 2 illustrates a second embodiment of the present invention, which is an example wherein trench gates are formed in such a manner that their directions cross each other at right angles between element areas each composed of several subareas.

In this IGBT 10', for example, the inside of its terminal area 11 is divided into smaller areas by a wiring area 14, and trench gates 15 in subareas 21, 22, 23 are formed in a manner that their directions cross each other at right angles between adjacent element areas 13a, 13b and 13c, so that the directions of stresses are substantially balanced. In the gate pad area 12 are provided subareas 13d and 13e adjacent to this area 12 and having perpendicular trench gates.

That is, each of at least three element areas 13a, 13b and 13c is further divided into subareas 21, 22 and 23, arranged such that in the subareas 21, 22 and 23 in each of the element areas 13a, 13b and 13c respective trench gates 15 are formed along the same direction and the directions of the trench gates of adjacent element areas 13a, 13b, 13c cross each other at right angles.

Such a structure also permits the directions of the stresses to be substantially balanced inside the IGBT 10'. Thus, substantially the same advantageous effects as by the IGBT 10 illustrated as the first embodiment can be obtained.

Moreover, even if the inside of the terminal area 11 is divided into smaller areas as shown by this IGBT 10', the case in which the respective trench gates 15 in all the element subareas 13d, 13e, 21, 22 and 23 have substantially the same length is effective, in particular, for IGBTs having a large area.

Additionally, the gate pad area 12 can be located not only at positions other than the central portion of the terminal area 11, as shown in the first and second embodiments of the present invention, but also at the central portion of the terminal area 11 (the center gate structure).

Figure 3:
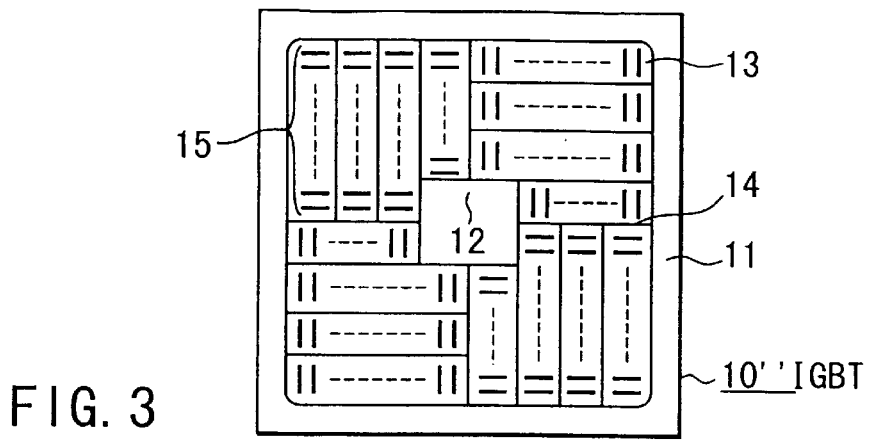
FIG. 3 is a schematic plan view illustrating a structure of an insulated gate type semiconductor device according to a third embodiment of this invention by way of an example of an IGBT having trench gates in a form of stripes.

FIG. 3 illustrates a third embodiment of the present invention, which is an example for realizing the center gate structure.

In this IGBT 10'', for example, a gate pad area 12 is arranged at the substantially central portion of a terminal area 11. The inside of the terminal area 11, except the gate pad areas 12, is divided into smaller areas by a wiring area 14, and plural element areas 13a to 13d are located so as to surround the periphery of the gate pad area 12.

In this case, for example, respective trench gates 15 are formed in such a manner that their directions cross each other at right angles between four element areas 13a to 13d, so that likewise the directions of stresses are substantially averaged as a whole.

Figure 4:
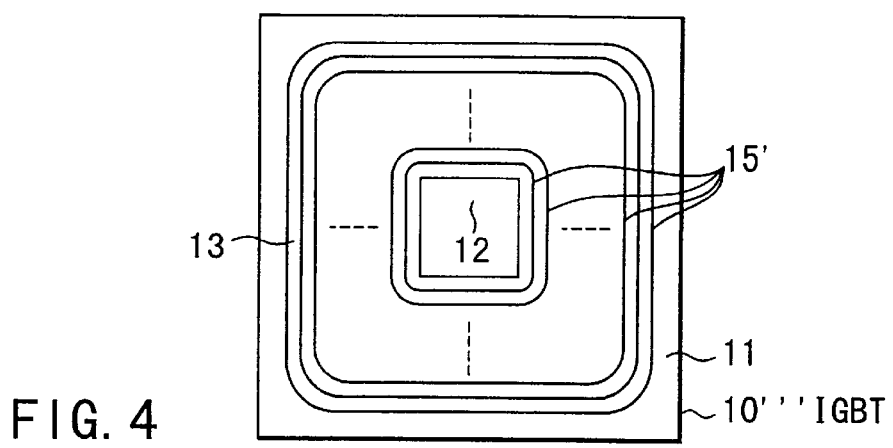
FIG. 4 is a schematic plan view illustrating structure of an insulated gate type semiconductor device according to a fourth embodiment of this invention by way of an example of an IGBT having trench gates in a form of closed loops.

FIG. 4 illustrates a fourth embodiment of the present invention, which is another example for realizing the center gate structure.

In this IGBT 10''', for example, a gate pad area 12 is arranged at the substantially central portion of a terminal area 11. Plural trench gates 15' in the form of closed loops are located in parallel to each other inside a single element area 13 so as to surround the periphery of the gate pad area 12.

In this case, each of the trench gates 15' is formed in the form of a loop. Therefore, it becomes possible to balance substantially the directions of stresses concentrating in only a single direction perpendicular to the stripe direction of the trench gates.

The following will describe a method making it possible to manufacture an insulated gate type semiconductor device uninfluenced by the stress of the gate electrode material (polysilicon) inside trenches.

Figure 5:
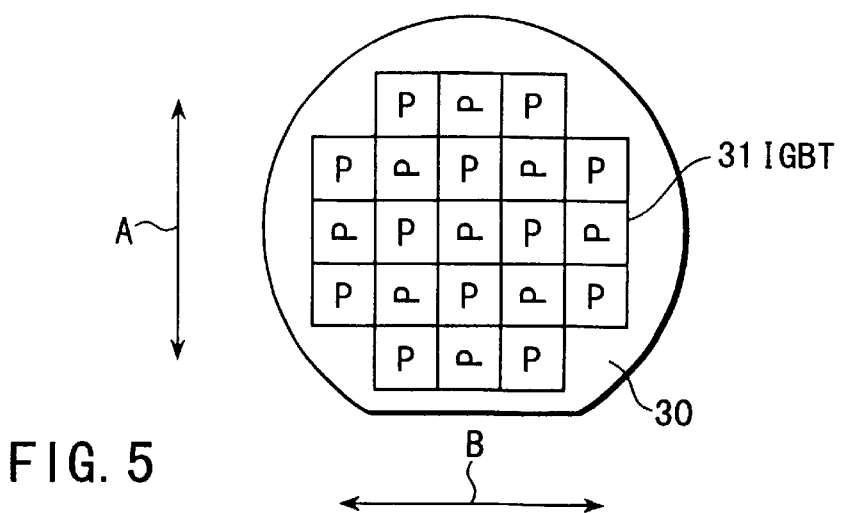
FIG. 5 is a plan view of a wafer illustrated for explaining an outline of an insulated gate type semiconductor device manufacturing method according to other embodiment of this invention.

FIG. 5 shows an outline of an insulated gate type semiconductor device manufacturing method according to another embodiment of the present invention by way of an example of an IGBT having trench gates in a stripe form.

For example, in manufacturing the IGBT having the trench gates in the stripe form, plural IGBT pellets (P) 31 are formed on a single wafer 30, and then the resultant is divided per IGBT pellet 31, thereby obtaining the plural IGBTs simultaneously.

At the time of formation, the IGBT pellets 31 adjacent to each other in their upward and downward directions and in their right and left directions are formed on the wafer 30, for example, in the state that any one of their directions (shown schematically by the directional orientation of "P") is rotated at an angle of about 90° to one another.

In this case, the IGBT pellets 31 can be easily formed, for example, by rotating the direction of a reticle composed of a single-pattern mask of a stepper used for exposing the IGBT pellets 31 to light whenever the exposure is performed, or by using as a reticle a pattern mask wherein any one of plural patterns is rotated at an angle of about 90° to the other.

In short, the respective IGBT pellets 31 are formed on the same wafer 30 so that the directions of their trench gates, which correspond to the directional orientations of the "P" in this case, cross each other at right angles.

Figure 7:
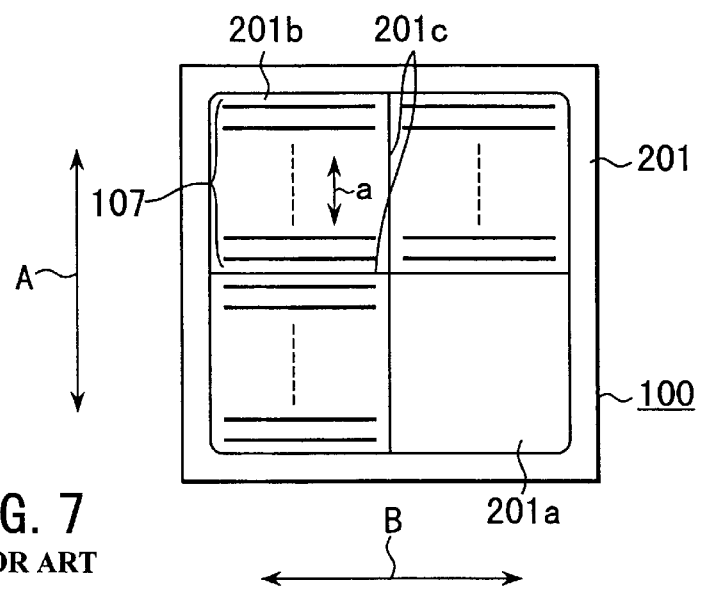
FIG. 7 is a schematic plan view of the whole structure of the conventional IGBT having the trench gates in the stripe form.
Figure 8:
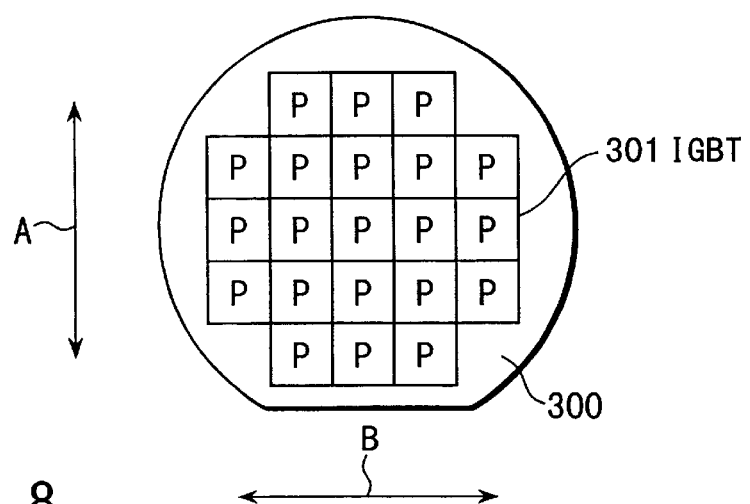
FIG. 8 is a plan view of a wafer illustrated for explaining an outline of a conventional insulated gate type semiconductor device manufacturing method.

This makes it possible to overcome concentration in a single direction of a strong stress generated in the direction perpendicular to the stripe direction of the trench gates in the respective IGBT pellets, even in the case of the IGBT pellet wherein the trench gates are formed along the same direction (see FIG. 7).

Therefore, it becomes possible to reduce the total of the stresses in a single direction and substantially balance the directions of the stresses inside the wafer 30. Consequently, the IGBTs are not influenced by the stresses in the single direction even in the case of using a wafer having a large diameter. Thus, it becomes possible to prevent a deterioration in the subsequent manufacturing process caused by a large bend and thus to manufacture the IGBTs satisfactorily.

Substantially the same advantageous effects can be obtained not only in the case wherein the IGBT pellets 31 adjacent to each other are formed so that the trench gates cross each other at right angles, but also in the case wherein the IGBT pellets 31 are formed so that their trench gates cross each other at right angles between units each composed of several of the IGBT pellets 31.

In particular, any one of the IGBT 10, the IGBT 10', the IGBT 10" or the IGBT 10''' described as the first through fourth embodiments, respectively, formed as the IGBT pellet 31 is effective for reducing bending of the wafer 30.

Furthermore, any one of the aforementioned embodiments can be applied not only to IGBTs having a trench gate structure but also various insulated gate type semiconductor devices having insulated gates of a trench structure, such as MOS (Metal Oxide Semiconductor), IEGT (Injection Enhanced Gate Transistor), or SI thyristor (Static Induction Thyristor).

Additionally the aforementioned embodiments can be applied not only to insulated gate type semiconductor devices having insulated gates of a trench structure but also various insulated gate type semiconductor devices having insulated gates of a planar structure.

The aforementioned embodiments are effective for reducing a thickness of its semiconductor substrate, in particular in the case wherein they are applied to various insulated gate type semiconductor devices having insulated gates of a planer structure.

There are not any restrictions to the length in the stripe direction of trench gates, the number of trench gates; the size, the shape or the number of element areas; the size or the number of pellets; or the like.

The above discussion describes the present invention, giving an example of polysilicon as a gate electrode material. However, the present invention is also effective for metal electrodes, metal silicide electrode and the like.

As described in detail, according to the present invention, a semiconductor device can be provided which makes it possible to relieve concentration of stresses in only a single direction and prevent the generation of a leakage current and crystal defects.

Furthermore, according to the present invention, a semiconductor device manufacturing method can be provided which makes it possible to relieve concentration of stresses in only a single direction and prevent the generation of a large bend in a wafer.

Obviously, numerous modifications and variations of the present invention are possible in light of the above teachings. It is therefore to be understood that within the scope of the appended claims, the invention may be practiced otherwise than as specifically described herein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   plural element areas arranged on a single substrate, each element area having plural trench gate electrodes which are in stripe form, arranged parallel to each other, and have a same size, and
   wherein one of at least two of the plural element areas has the trench gate electrodes thereof arranged in parallel with a boundary between said at least two of the plural element areas, and the other of said at least two of the plural element areas has the trench gate electrodes thereof arranged at right angles to the boundary.

2. The semiconductor device according to claim 1, wherein the gate electrodes are insulated gates in a trench form.

3. The semiconductor device according to claim 1, wherein the gate electrodes are insulated gates in a planar form.

4. A semiconductor device comprising:
   plural element areas arranged on a single substrate, each element area having a plurality of elements comprising vertical-type transistors arranged in parallel with each other, the vertical-type transistors having plural trench gate electrodes which are in stripe form and have a same size,
   wherein one of at least two adjoining of the plural element areas has the trench gate electrodes thereof arranged in parallel with a boundary between said at least two adjoining of the plural element areas, and the other of said at least two adjoining of the plural element areas has the trench gate electrodes thereof arranged at right angles to the boundary.

5. A semiconductor device comprising:
   a semiconductor substrate;
   a gate pad area located inside a terminal area on the semiconductor substrate;
   a wiring area located inside the terminal area, for leading wirings from the gate pad area; and
   plural element areas which are divided by the wiring area and are located inside the terminal area, each element area having trench gate electrodes which are in stripe form, arranged in parallel, and have a same size,
   wherein the wiring area is located at least in part between at least two of the plural element areas and one of said at least two of the plural element areas has the trench gate electrodes thereof arranged in parallel with the wiring area located between said at least two of the plural element areas, and the other of said at least two of the plural element areas has the trench gate electrodes thereof arranged at right angles to the wiring area located between the at least two of the plural element areas.

* * * * *